United States Patent [19]
Ishikawa

[11] Patent Number: 6,130,850
[45] Date of Patent: Oct. 10, 2000

[54] SEMICONDUCTOR STORAGE DEVICE WITH SERIAL-PARALLEL CONVERSION FUNCTION

[75] Inventor: Toru Ishikawa, Tokyo, Japan

[73] Assignee: NEC Corporation, Tokyo, Japan

[21] Appl. No.: 09/311,978

[22] Filed: May 14, 1999

[30] Foreign Application Priority Data

May 15, 1998 [JP] Japan .................................. 10-133684

[51] Int. Cl.[7] ............................................ G11C 7/00
[52] U.S. Cl. ................................................ 365/219
[58] Field of Search ................................ 365/219, 220, 365/221, 238, 189.04

[56] References Cited

U.S. PATENT DOCUMENTS 5,473,577  12/1995  Miyake et al. .......................... 365/238
5,953,244   9/1999  Okada ..................................... 365/63

*Primary Examiner*—David Nelms
*Assistant Examiner*—David Lam

[57] ABSTRACT

A semiconductor storage device with serial-parallel conversion function which enables operation to be high speed while shortening a period of input/output of data. Data inputted in serial condition is converted in parallel condition to be written into memory array, before reading-out the data in parallel condition from the memory array to be outputted in serial condition. There is provision of a memory array whose speed of input/output of data is high, and a memory array whose speed of input/output is regular. High speed memory array stores therein data which is inputted finally and data which is outputted in the first place.

7 Claims, 2 Drawing Sheets

SEMICONDUCTOR STORAGE DEVICE WITH SERIAL-PARALLEL CONVERSION FUNCTION

BACKGROUND OF THE INVENTION

The present invention relates to a semiconductor storage device with parallel-serial conversion function which causes data to be read in parallel condition to be outputted in serial condition, and which causes the data to be inputted to an internal memory in serial condition to be written in parallel condition. More to particularly, this invention relates to a semiconductor storage device with parallel-serial conversion function whose write speed to the internal memory and read speed from the internal memory are improved.

DESCRIPTION OF THE PRIOR ART

In recent years, in the computer and so forth, the semiconductor storage device with serial-parallel conversion function is increasing with high speed of operation of memory section using the semiconductor device realized. The serial-parallel function is that large amount of data are read at a time from the internal memory to be outputted in serial condition, while the data is inputted into the internal memory in serial condition to be written in parallel condition.

In the above-described semiconductor storage device, for instance, in the case of the serial-parallel conversion of RAM BUS DRAM (Dynamic Random Access Memory), rate for serial-parallel conversion is "1 bit (for serial)×8 bits (for parallel)". In the case of the serial-parallel conversion of DRAM of DDR (Double Data Rate), rate for serial-parallel conversion "1 bit (for serial)×2 bits (for parallel)".

However, according to the conventional semiconductor storage device with serial-parallel conversion function, when data which is outputted in the first place as a serial data out of the data stored in the internal memory as parallel data is read-out from the internal memory, the most difficult access occurs in that access time is in excess of fixed time period. On the other hand, data is written into the internal memory while converting inputted serial data into parallel data, when the last serial data is written therein, the most difficult access occurs in that access time is in excess of fixed time period. Therefore, it is necessary to lengthen a periodic time of clock for inputting/outputting data in order to adjust it thereto.

SUMMARY OF THE INVENTION

In view of the foregoing, it is an object of the present invention, in order to overcome the above-mentioned problem, to provide a semiconductor storage device with serial-parallel conversion function which enable the periodic time of clock to be shortened for inputting/outputting data, and which causes write speed and read speed to be high speed.

According to a first aspect of the present invention, in order to achieve the above-mentioned object, there is provided a semiconductor storage device with serial-parallel conversion function in which data is read-out from a plurality of memory arrays in parallel condition to be outputted in serial condition, which comprises a first memory array for storing therein data which is outputted in the first place, and a second memory array for storing data which is outputted following after the data which is outputted in the first place, wherein the first memory array has higher read-out speed than the second memory array.

According to a second aspect of the present invention, there is provided a semiconductor storage device with serial-parallel conversion function in which data inputted in serial condition is converted in parallel condition to be written to a plurality of memory arrays, which comprises a first memory array for storing therein data which is inputted finally, and a second memory array for storing data which is inputted before the data is inputted finally, wherein the first memory array has higher write speed than the second memory array.

According to a third aspect of the present invention, there is provided a semiconductor storage device with serial-parallel conversion function in which data inputted in serial condition is converted in parallel condition to be written into a plurality of memory arrays, and then said data is read-out in parallel condition from the plurality of memory arrays to be outputted in serial condition, which comprises a first memory array whose speed of input/output of the data is high, and a second memory array whose speed of input/output of the data is lower than that of the first memory array, wherein the first memory array stores therein both of data which is inputted finally and data which is outputted in the first place.

According to a fourth aspect of the present invention, in the third aspect, there is provided a semiconductor storage device with serial-parallel conversion function, wherein the first memory array comprises a write port connected to a serial data input line through an input circuit which is activated by "1" of a clock signal, and a read-out port connected to a serial data output line through an output circuit which is activated by "1" of the clock signal.

According to a fifth aspect of the present invention, in the third aspect, there is provided a semiconductor storage device with serial-parallel conversion function, wherein second memory array comprises an input circuit to which data is inputted from a serial data input line while being activated by "0" of the clock signal, a write port connected to the serial data input line through a latch for latching data outputted from the input circuit while being activated by "0" of the clock signal, a latch for latching read data of "1" of the clock signal, and a read-out port connected to a serial output line through an output circuit for outputting the read-out data which is latched by the latch by "0" of the clock signal.

According to a sixth aspect of the present invention, in the fourth aspect, there is provided a semiconductor storage device with serial-parallel conversion function, wherein the sum of set up time for the sake of write of the first memory array and operation delay time of the input circuit is approximately ½ of period of the clock signal.

According to a seventh aspect of the present invention, in the fifth aspect, there is provided a semiconductor storage device with serial-parallel conversion function, wherein the sum of read-out delay time of the first memory array and set up time of the output circuit is approximately ½ of period of the clock signal.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of a semiconductor storage device with serial-parallel conversion function of the present invention will be described in detail in accordance with the accompanying drawings.

Figure 1:
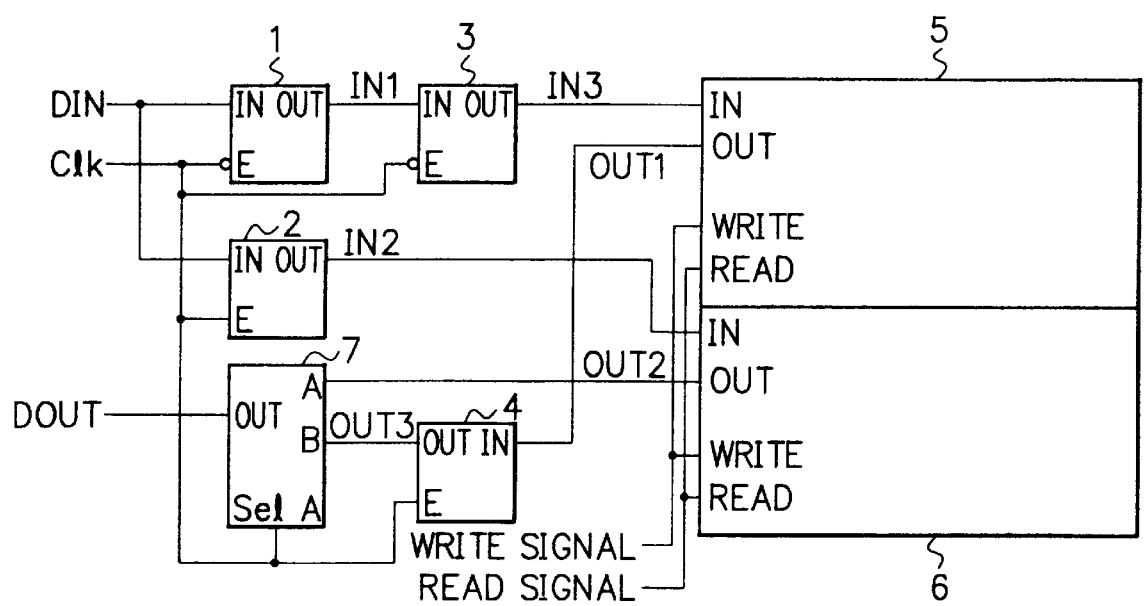
FIG. 1 is a block diagram showing one embodiment of a semiconductor storage device with serial-parallel conversion function according to the present invention.

FIG. 1 shows a semiconductor storage device with serial-parallel conversion function of the present invention. The semiconductor storage device is provided with an input circuit 1 which is activated by a clock signal "0", an input circuit 2 which is activated by a clock signal "1", a latch 3 which is activated by a clock signal "0", a latch 4 which is activated by a clock signal "1", a selector 7 which selects to be outputted data of input A in accordance with the clock signal of "1", while which selects to be outputted data of input B in accordance with the clock signal of "0", a memory array 5 whose write port IN is connected to output OUT of the latch 3, and whose read-out port OUT is connected to input IN of the latch 4, having regular write speed and regular read speed, and a memory array 6 whose write port IN is connected to output OUT of the input circuit 2, and whose read-out port OUT is connected to the input A of the selector 7, having high speed of write and read-out. Here, IN1, IN2, and IN3 are data buses for the sake of write operation. OUT1, OUT2, and OUT3 are data buses for the sake of read-out operation. DIN is an input line of the serial data. DOUT is an output line of the serial data. Clk is an input line of the clock signal.

Figure 2A:
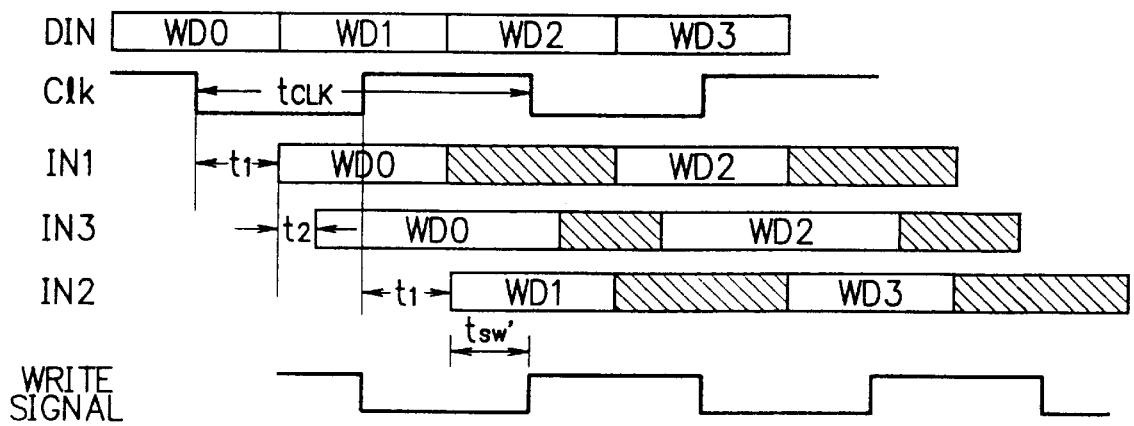
FIG. 2A is a timing chart showing timing of write of the data in the semiconductor storage device with serial-parallel conversion function according to the present invention.
Figure 2B:
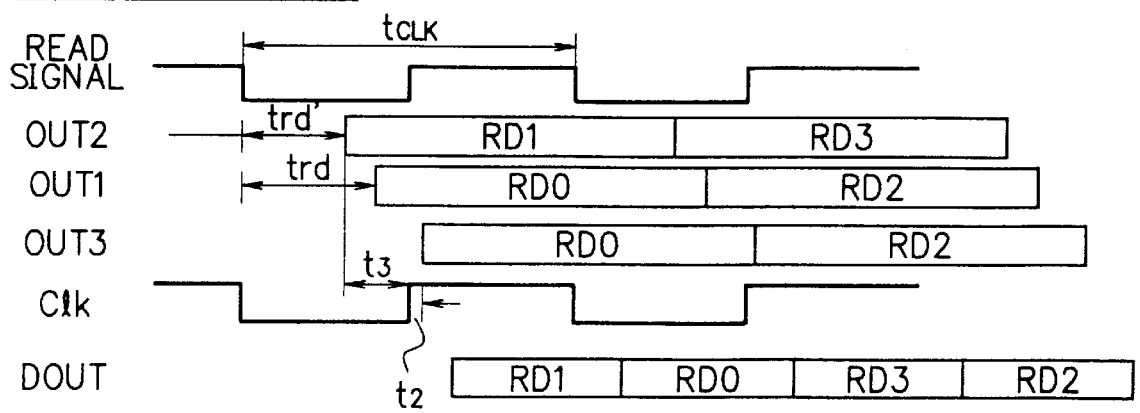
FIG. 2B is a timing chart showing timing of read of the data in the semiconductor storage device with serial-parallel conversion function according to the present invention.

FIG. 2A and 2B show a timing chart of data input/output in the semiconductor storage device with serial-parallel conversion function according to the present invention. Hereinafter, operation of the semiconductor storage device with serial-parallel conversion function of the present invention will be described referring to FIGS. 1, 2A and 2B.

The semiconductor storage device with serial-parallel conversion function shown in FIG. 1 has function that the data is subjected to the serial-parallel conversion of 1 to 2 in that rate of the serial-parallel conversion is to be 1 bit (for serial)×2 bits (for parallel). There is described the case where the write into the memory arrays 5, and 6 of WD0, WD1, WD2 and WD3 is performed. The write data is inputted in order of WD0, WD1, WD2, and WD3 from the input line DIN. WD0 and WD1, and WD3 and WD4 are converted into parallel data respectively to be written into the memory arrays 5, and 6. The WD1, and the WD3 which are written finally as a unit of serial input of the data into the high speed memory array 6 through the input circuit 2. The WD0, and the WD2 which are written in the first place as a unit of serial input of the data into the regular speed memory array 5 through the input circuit 1 and the latch 3.

In the case of read for the data RD0, RD1, RD2, and RD3, the data (RD1, RD3) which are outputted from the high speed memory array 6 are inputted into A side of the selector 7. The data (RD0, RD2) which are outputted from the regular speed memory array 5 are inputted into B side of the selector 7 through the latch 4. When the clock signal is "1", data of the input A is selected synchronously with the clock signal inputted from the Clk line, thus being outputted in serial condition from the output line DOUT of the selector 7. When the clock signal is "0", data of the input B is selected synchronously with the clock signal inputted from the Clk line, thus being outputted in serial condition from the output line DOUT of the selector 7.

The input circuits 1, and 2 are the clock synchronization type, thus having a delay of t1 regarding the clock signal. The data of the WD0 is outputted from the input circuit 1 to the latch 3 after t1 from the trailing edge of the clock signal, and in "0" of the clock signal, the data of WD0 is latched by the latch 3. The data of the WD1 is outputted to the memory array after t1 from the leading edge of the clock signal.

The write signal which is synchronized with the clock signal in opposite phase is to be active in "0". Consequently, the data WD0 on the input line IN3 latched by the latch 3 has sufficient set up time regarding the write signal. On the other hand, the set up time tsw of the data WD1 on the input line IN2 outputted from the input circuit 2 becomes the value that delay time t1 is subtracted from the time of ½ of the period of the write signal.

On the other hand, the read signal is synchronized with the clock signal in in-phase. The RD0 is outputted from the memory array 5 of the regular speed with delay time trd, while the RD1 is outputted from the memory array 6 of the high speed with delay time trd'. The RD0 is latched by the latch 4 after the delay time t2 elapsing from the leading edge of the clock signal, thus the input B of the selector 7 is selected to be outputted to the output line DOUT at the time of the trailing edge of the next clock signal. Before above-described matters, the data (RD1) on the output line OUT2 is outputted to the output line DOUT on the ground that the input A of the selector 7 is selected due to the leading edge of the clock signal.

In this example, regarding the memory array 6 of high speed, both of read and write are high speed memory arrays. Thereby, the data which is written in order of WD0 and WD1 is outputted in reverse order of RD1 and RD0.

As mentioned above, write of the data WD0 and WD1, and read-out of RD0 and RD1 are described. Also write of the data WD2 and WD3, and read-out of the data RD2 and RD3 are outputted similarly.

As was mentioned above, operation of the semiconductor storage device with serial-parallel conversion function of the present invention is described. Hereinafter, a clock period of the memory in the semiconductor storage device with serial-parallel conversion function of the present invention will be described.

As mentioned above, delay time from the clock signal of the input circuits 1, and 2 is taken to be t1. Set up time of the latches 3, and 4 is taken to be t2. Set up time of the selector 7 is taken to be t3. Set up time of the write of the memory array 5 is taken to be tsw. Set up time of the write of the memory array 6 is taken to be tsw' (tsw'<tsw). Delay time of the read of the memory array 5 is taken to be trd. Delay time of the read of the memory array 6 is taken to be trd' (trd'<trd). Period of the clock signal is taken to be tCLK. Here, the set up time t2 of the latches 3, and 4 is smaller than the set up time tsw of the memory array 5 (t2<tsw).

In the above mentioned condition, limit of the period of the write of the data for the memory arrays 5, and 6 is compared with the conventional case. The set up time of the memory array in the conventional semiconductor storage device with serial-parallel conversion function is tsw uniformly. The minimum clock period becomes:

$$tCLK/2 = t1 + tsw$$

Relative to this, according to the semiconductor storage device with serial-parallel conversion function of the present invention, since the set up time of the high speed memory array 6 is improved from tsw to tsw', the minimum clock period is improved as being:

$$tCLK/2 = t1 + tsw'$$

Next, limit of the period of the read of the data from the memory arrays 5, and 6 is compared with the conventional case. In the conventional semiconductor storage device with serial-parallel conversion function, the minimum clock is restricted by the read delay time trd of the memory array and the set up time t3 for outputting accurately with clock synchronization of the selector 7. Consequently, according to the conventional storage device with serial-parallel conversion function, the minimum clock period becomes:

$$tCLK/2 = t3 + trd$$

Relative to this, according to the semiconductor storage device with serial-parallel conversion function, since the read delay time of the high speed memory array 6 is improved from trd to trd' the minimum clock period is improved as being;

$$tCLK/2 = t3 + trd'$$

As was mentioned above, one embodiment of the present invention is indicated, it is desirable not only the semiconductor storage device with serial-parallel conversion function of 1 bit (for serial)×2 bits (for parallel), but also the semiconductor storage device with serial-parallel conversion function of 1 bit (for serial)×4 bits (for parallel), or 1 bit (for serial)×8 bits (for parallel). In these cases, high speed memory array becomes ¼, ⅛ of the whole memory, capacity of the high speed memory array is not much.

As was mentioned above, according to the semiconductor storage device with serial-parallel conversion function of the present invention, there is provided the memory array which can write in high speed in comparison with another memory array. The high speed write array is reserved for the serial data which is inputted finally. Further, there is provided the memory array which can read in high speed in comparison with another memory array. The high speed read array is reserved for the serial data which is outputted in the first place from the memory. Input/output of the data is implemented in high speed while shortening the period of input/output of the data.

While preferred embodiments of the invention have been described using specific terms, the description has been for illustrative purpose only, and it is to be understood that changes and variations may be made without departing from the spirit or scope of the following claims.

What is claimed is:

1. A semiconductor storage device with serial-parallel conversion function in which data is read-out from a plurality of memory arrays in parallel condition to be outputted in a serial condition, comprising:

a first memory array for storing therein first data;

a second memory array for storing second data, the first memory array having a higher read-out speed than the second memory array, the data cycles of the first memory array and the second memory array being the same and the delay time of the first memory array being shorter than the delay time of the second memory array;

read-out circuitry which first reads the first data from the first memory array and then reads the second data from the second memory array; and means for serially outputting the first data and the second data wherein said first data is outputted before the second data.

2. A semiconductor storage device with serial-parallel conversion function in which data inputted in serial condition is converted in parallel condition to be written to a plurality of memory arrays, comprising:

a first memory array for storing therein first data;

a second memory array for storing second data, said first memory array having a higher write speed than said second memory array, the data cycles of the first memory array and the second memory array being the same and the delay time of the first memory array being shorter than the delay time of the second memory array; and write circuitry which first inputs the second data into the second memory array and then inputs the first data into the first memory array, the set up time of the first memory array being smaller than the set up time of the second memory array.

3. A semiconductor storage device with serial-parallel conversion function in which data inputted in serial condition is converted in parallel condition to be written into a plurality of memory arrays, and then said data is read-out in parallel condition from said plurality of memory arrays to be outputted in serial condition, comprising:

a first memory array whose speed of input/output of data is high;

a second memory array whose speed of input/output of data is lower than that of said first memory array, the data cycles of the first memory array and the second memory array being the same, the delay time of the first memory array being shorter than the delay time of the second memory array, and the set up time of the first memory array being smaller than the set up time of the second memory array; and read and write circuitry for inputting and outputting first and second data into and out of said first and second memory arrays, said read and write circuitry inputting said first data into said first memory array after inputting said second data into said second memory array and outputting said first data from said first memory array before outputting said second data from said second memory array.

4. A semiconductor storage device with serial-parallel conversion function in which data inputted in serial condition is converted in parallel condition to be written into a plurality of memory arrays, and then said data is read-out in parallel condition for said plurality of memory arrays to be outputted in serial condition, comprising:

a first memory array whose speed of input/output of data is high;

a second memory array whose speed of input/output of data is lower than that of said first memory array; and read and write circuitry for inputting and outputting said first and second data into and out of said first and second memory arrays, said read and write circuitry inputting said first data into said first memory array after inputting said second data into said second memory array and outputting said first data from said first memory array before outputting said second data from said second memory array, wherein said first memory array comprises a write port connected to a serial data input line through an input circuit which is activated by "1" of a clock signal, and a read-out port connected to a serial data output line through an output circuit which is activated by "1" of the clock signal.

5. A semiconductor storage device with serial-parallel conversion function as claimed in claim 4, wherein said first memory array has a write set up time and said input circuit has an operation delay time and the sum of said set up time and said operation delay time of said input circuit is approximately ½ of a period of said clock signal.

6. A semiconductor storage device with serial-parallel conversion function in which data inputted in serial condition is converted in parallel condition to be written into a plurality of memory arrays, and then said data is read-out in parallel condition from said plurality of memory arrays to be outputted in serial condition, comprising:

a first memory array whose speed of input/output of data is high;

a second memory array whose speed of input/output of data is lower than that of said first memory array; and read and write circuitry for inputting and outputting said first and second data into and out of said first and second memory arrays, said read and write circuitry inputting said first data into said first memory array and inputting said second data into said second memory array and outputting said first data from said first memory array before outputting said second data from said second memory array, wherein said second memory array comprises an input circuit to which data is inputted from a serial data input line while being activated by "0" of the clock signal, a write port connected to said serial data input line through a latch for latching data outputted from said input circuit while being activated by "0" of the clock signal, a latch for latching read data of "1" of the clock signal, and a read-out port connected to a serial output line through an output circuit for outputting said read-out data which is latched by said latch by "0" of the clock signal.

7. A semiconductor storage device with serial-parallel conversion function as claimed in claim 6, wherein said first memory array has a read-out delay time and said output circuit has a set up time and the sum of said read-out delay time of said first memory array and said set up time of said output circuit is approximately ½ of a period of said clock signal.

* * * * *